(12) United States Patent
Tamura et al.

(10) Patent No.: US 6,900,510 B2
(45) Date of Patent: May 31, 2005

(54) MEMS DEVICES AND METHODS FOR INHIBITING ERRANT MOTION OF MEMS COMPONENTS

(75) Inventors: Hirokazu Tamura, Wellesley, MA (US); Matthew J. Neal, Marlborough, MA (US); Alan L. Sidman, Wellesley, MA (US); Jiang Zhe, Shrewsbury, MA (US)

(73) Assignees: Advanced Microsensors, Shrewsbury, MA (US); Furukawa America, Inc., Clinton, NJ (US)

( * ) Notice: Subject to any disclaimer, the term of this patent is extended or adjusted under 35 U.S.C. 154(b) by 265 days.

(21) Appl. No.: 10/309,964

(22) Filed: Dec. 4, 2002

(65) Prior Publication Data

US 2003/0155841 A1 Aug. 21, 2003

Related U.S. Application Data

(63) Continuation-in-part of application No. 10/079,985, filed on Feb. 21, 2002, now Pat. No. 6,717,227.

(51) Int. Cl.[7] ............................................. H01L 29/82
(52) U.S. Cl. ...................... 257/421; 257/52; 257/254; 257/415; 257/419; 257/421; 369/119; 438/73
(58) Field of Search ............................ 257/421, 52, 254, 257/415, 419; 369/119; 438/73

(56) References Cited

U.S. PATENT DOCUMENTS

| | | | |
|---|---|---|---|
| 5,206,983 A | 5/1993 | Guckel et al. | |
| 5,327,033 A | 7/1994 | Guckel et al. | |
| 5,629,918 A | 5/1997 | Ho et al. | |
| 5,644,177 A | 7/1997 | Guckel et al. | |
| 5,778,513 A | 7/1998 | Miu et al. | |
| 5,808,384 A | 9/1998 | Tabat et al. | |
| 5,909,078 A | 6/1999 | Wood et al. | |

(Continued)

FOREIGN PATENT DOCUMENTS

| | | |
|---|---|---|
| EP | 1 081 722 | 3/2001 |
| EP | 1 164 601 | 12/2001 |
| WO | WO 00/05734 | 2/2000 |

OTHER PUBLICATIONS

Bhansali et al., "Prototype Feedback–Controlled Bidirectional Actuation System for MEMS Applications," Journal of Microelectromechanical Systems, 9 (2): 245–251 (Jun. 2000).

(Continued)

*Primary Examiner*—Michael Tran
*Assistant Examiner*—Mai-Huong Tran
(74) *Attorney, Agent, or Firm*—Foley Hoag LLP

(57) ABSTRACT

A Microelectromechanical (MEMS) device and method of fabrication that can minimize derailing of an actuable element of the MEMS device during fabrication can include a MEMS actuator to selectively generate displacement forces to displace an actuable element along a path between sidewalls of a channel. The sidewalls can have stops formed therein that can interact with surfaces on the actuable element to limit displacement of the actuable element during fabrication. One of the sidewalls can be indented to form the stops and the actuable element can have an arm portion that extends between the stops. The sidewalls can be offset to form the stops on spaced apart faces on opposite sides of the channel and the actuable element can be offset between the spaced apart faces to form offset faces in an opposing relationship with the spaced apart faces on the sidewalls. In addition, the actuable element and the sidewalls may be so shaped as to maintain a generally constant width between them.

27 Claims, 4 Drawing Sheets

U.S. PATENT DOCUMENTS

| | | | |
|---|---|---|---|
| 5,929,542 | A | 7/1999 | Ohnstein et al. |
| 5,994,816 | A | 11/1999 | Dhuler et al. |
| 6,085,016 | A | 7/2000 | Espindola et al. |
| 6,087,743 | A | 7/2000 | Guckel et al. |
| 6,122,149 | A | 9/2000 | Zhang et al. |
| 6,137,941 | A | 10/2000 | Robinson |
| 6,163,643 | A | 12/2000 | Bergmann et al. |
| 6,166,478 | A | 12/2000 | Yi et al. |
| 6,171,886 | B1 * | 1/2001 | Ghosh et al. ............... 438/73 |
| 6,173,105 | B1 | 1/2001 | Aksyuk et al. |
| 6,222,954 | B1 | 4/2001 | Riza |
| 6,246,826 | B1 | 6/2001 | O'Keefe et al. |
| 6,255,757 | B1 | 7/2001 | Dhuler et al. |
| 6,262,463 | B1 | 7/2001 | Miu et al. |
| 6,265,239 | B1 | 7/2001 | Aksyuk et al. |
| 6,275,320 | B1 | 8/2001 | Dhuler et al. |
| 6,285,504 | B1 | 9/2001 | Diemeer |
| 6,300,619 | B1 | 10/2001 | Aksyuk et al. |
| 6,308,631 | B1 | 10/2001 | Smith et al. |
| 6,324,748 | B1 | 12/2001 | Dhuler et al. |
| 6,327,855 | B1 | 12/2001 | Hill et al. |

OTHER PUBLICATIONS

Stephen Cohen, "Novel VOAs Provide More Speed and Utility," Laser Focus World, pp. 139–146 (Nov. 2000).

Christenson and Guckel, "An Electromagnetic Micro Dynamometer," 1995 IEEE MEMS Proceedings, Amsterdam, the Netherlands, pp. 386–391, Jan. 29–Feb. 2, 1995.

Gong and Zhou, "Micromachined Electromagnetic Actuator," Proceedings of the International Symposium on Test & Measurement, ISTM, pp. 23–26 (1999).

Guckel et al., "Laterally Driven Electromagnetic Actuators," Solid–State Sensor and Actuator Workshop, Hilton Head, South Carolina, pp. 49–52 (Jun. 13–16, 1994).

Guckel et al., "Design and Testing of Planar Magnetic Micromotors Fabricated by Deep X–Ray Lithography and Electroplating," The 7$^{th}$ International Conference on Solid–State Sensors and Actuators, Yokohama, Japan, pp. 76–79, (Jun. 7–10, 1993).

Guckel et al., "Fabrication and Testing of the Planar Magnetic Micromotor," J. Micromech. Microeng. 1: 135–138, (1991).

Guckel et al., "Electromagnetic, Spring Constrained Linear Actuator with Large Throw," Actuator'94, pp. 52–55, (Bremen, Germany Jun. 15–17, 1994).

Guckel et al., "Micromechanics for Actuators Via Deep X–Ray Lithography," SPIE vol. 2194, pp. 2–10.

Guckel et al., "Processing and Design Considerations for High Force Output– Large Throw Electrostatics, Linear Microactuators," Actuator 94, Bremen, Germany pp. 105–108, (Jun. 15–17, 1994) (Abstract).

H. Guckel and University of Wisconsin, Madison, "Photograph of Actuator," online, retrieved on Feb. 1, 2002 from URL http://mems.engr.wisc.edu/images/linear/intgrated_coil.jpg.

Guckel et al., "Micro Electromagnetic Actuators Based on Deep X–Ray Lithography," International Symposium on Microsystems, Intelligent Materials and Robots, Sendai, Japan, Sep. 27–29, (1995) (Abstract).

Miyajima et al., "A Durable, Shock–Resistant Electromagnetic Optical Scanner with Polyimide–Based Hinges," Journal of Microelectromechanical Systems 10 (3): 418–424, (Sep. 2001).

Ohnstein et al., "Tunable IR Filters with Integral Electromagnetic Actuators," Solid–State Sensor and Actuator Workshop, Hilton Head, South Carolina, pp. 196–199. (Jun. 2–6, 1996).

Sadler et al., "A Universal Electromagnetic Microactuator Using Magnetic Interconnection Concepts," Journal of Microelectromechanical Systems 9(4): 460–468, (Dec. 2000).

Sadler et al., "A New Electromagnetic Actuator Using Through–Hole Plating of Nickel/Iron Permalloy," Electrochemical Society Proceedings vol. 98(20): 377–388.

Wright et al., "A Large–Force, Fully–Integrated MEMS Magnetic Actuator," Transducers 97, International Conference on Solid–State Sensors and Actuators, pp. 793–796, (Chicago, Jun. 16–19, 1997).

* cited by examiner

MEMS DEVICES AND METHODS FOR INHIBITING ERRANT MOTION OF MEMS COMPONENTS

CROSS-REFERENCE TO RELATED APPLICATIONS

This application is a continuation-in-part of U.S. patent application Ser. No. 10/079,985, filed Feb. 21, 2002 now U.S. Pat. No. 6,717,227, which is incorporated herein by reference.

BACKGROUND

Advances in micro-electronic fabrication technology have allowed the creation of Micro-Electrical Mechanical Systems (MEMS) capable of motion and applying force at the micron level. By using micro-electronic fabrication techniques, MEMS devices may be mass-produced in batches. Such micro-electronic fabrication techniques can include release etching and wet etching. Vibration and/or agitation during and/or subsequent to wet etching of MEMS devices can result in contact between component surfaces of the MEMS devices. Surface tension or capillary action of the fluid used in the etching process can cause stiction between the components of the MEMS device. Components capable of motion may be displaced from their intended path of motion so as to become inoperable. It remains a difficult challenge to fabricate a plurality of MEMS devices having components capable of motion while minimizing errant motions of the components during the fabrication process, especially during the etching process and/or other process steps where such components may be subject to vibration and/or agitation that can result in contact between component surfaces of the MEMS devices.

SUMMARY

Disclosed herein are MEMS devices and methods of manufacturing MEMS devices that can minimize errant motion of the components of a MEMS device, particularly during fabrication of the MEMS device.

In one exemplary embodiment, the MEMS device may include a substrate, an actuable element, an actuator disposed on the surface of the substrate for selectively applying a first force to the actuable element to displace the actuable element along a displacement path adjacent at least one sidewall of a channel formed in the substrate, and a stop located on the at least one sidewall of the channel to restrict displacement of the actuable element along the path during fabrication. In one embodiment having a second stop, the stops may be located on opposing faces of an indented portion of the at least one sidewall and the actuable element can comprise a stop arm extending from the actuable element in a direction towards the indented portion to a point between the stops on the opposing faces of the indented portion. At least one cantilever, for controlling the displacement of the actuable element along the displacement path during operation of the MEMS device, can couple to the substrate at a first end and couple to the actuable element at a second end adjacent the stop arm. A distance between the actuable element and the at least one sidewall of the channel can be maintained generally constant along the displacement path.

In a further exemplary embodiment, a MEMS device can have stops located on opposing sidewalls of the channel and spaced apart in a direction along the displacement path. The actuable element can comprise an offset portion between the stops and the offset portion can have offset faces on opposite ends thereof, such that each offset face may be in an opposed relationship with one of the stops. A distance between the actuable element and the sidewalls of the channel can be maintained generally constant along the displacement path.

In embodiments including a pair of stops, the stops can be located on opposing sidewalls of the channel and can extend from the sidewalls into the channel to reduce a width of the channel to less than a width of a first portion of the actuable element.

The stops may extend equally from each side of the channel and may be located adjacent a gap formed by the ends of the magnetic core of the MEMS actuator. The first portion can comprise magnetic material, to which the actuator can apply a magnetic field, or the first portion can comprise tabs extending from the actuable element towards the sidewalls of the channel. The tabs can extend equally from opposing sides of the actuable element. The stops and the first portion of the actuable element can have contact surfaces configured to reduce stiction between the stops and the first portion of the actuable element, such as by dimpling or anti-stiction coatings.

In another embodiment, a MEMS device can include a substrate, an actuable element and an actuator disposed on the surface of the substrate for selectively applying a first force to the actuable element to displace the actuable element along a displacement path adjacent a sidewall of a channel formed in the substrate. An indented portion of the sidewall may form stops on opposing faces of the indented portion, such that the opposing faces may be generally perpendicular to the displacement path. A stop arm portion of the actuable element can extend in a direction towards the indented portion to a position between the stops so as to restrict displacement of the actuable element to movement of the stop arm between the stops.

In yet another exemplary embodiment, means for restricting displacement along a displacement path of an actuable element of a MEMS device so as to minimize derailing of the actuable element from a channel formed at least one sidewall along the displacement path can comprise means for indenting the at least one sidewall to form opposed stop faces thereon, means for extending an arm portion of the actuable element to a position between the opposed stop faces and means for maintaining a width between the at least one sidewall and the actuable element generally constant along the displacement path.

In a further exemplary embodiment, means for restricting displacement along a displacement path of an actuable element of a MEMS device so as to minimize derailing of the actuable element from a channel formed by sidewalls along the displacement path can comprise means for offsetting the channel to form spaced apart stop faces on opposite sidewalls of the channel, means for offsetting the actuable element at a position between the stop faces to form offset faces on opposite sides of the actuable element and in opposing relationship to the stop faces and means for maintaining a width between the sidewalls and the actuable element generally constant along the displacement path.

A method of restricting displacement along a displacement path of an actuable element of a MEMS device so as to minimize derailing of the actuable element from a channel formed by at least one sidewall along the displacement path can comprise indenting the at least one sidewall to form opposed stop faces thereon, extending an arm portion of the actuable element to a position between the opposed stop faces and maintaining a width between the at least one sidewall and the actuable element generally constant along the displacement path.

Another method of restricting displacement along a displacement path of an actuable element of a MEMS device so as to minimize derailing of the actuable element from a channel formed by sidewalls along the displacement path can comprise offsetting the channel to form spaced apart stop faces on opposite sidewalls of the channel, offsetting the actuable element at a position between the stop faces to form offset faces on opposite sides of the actuable element and in opposing relationship to the stop faces and maintaining a width between the sidewalls and the actuable element generally constant along the displacement path.

BRIEF DESCRIPTION OF THE DRAWINGS

These and other features of the MEMS devices disclosed herein will be more fully understood by reference to the following detailed description in conjunction with the attached drawings. In the attached drawings, like reference numerals refer to like parts throughout the different views, and reference numerals that differ by increments of 100 refer to similar parts in different embodiments. While the drawings illustrate principles of the MEMS devices disclosed herein, they are not drawn to scale, but may show only relative dimensions.

DETAILED DESCRIPTION OF CERTAIN EXEMPLARY EMBODIMENTS

Figure 1A:
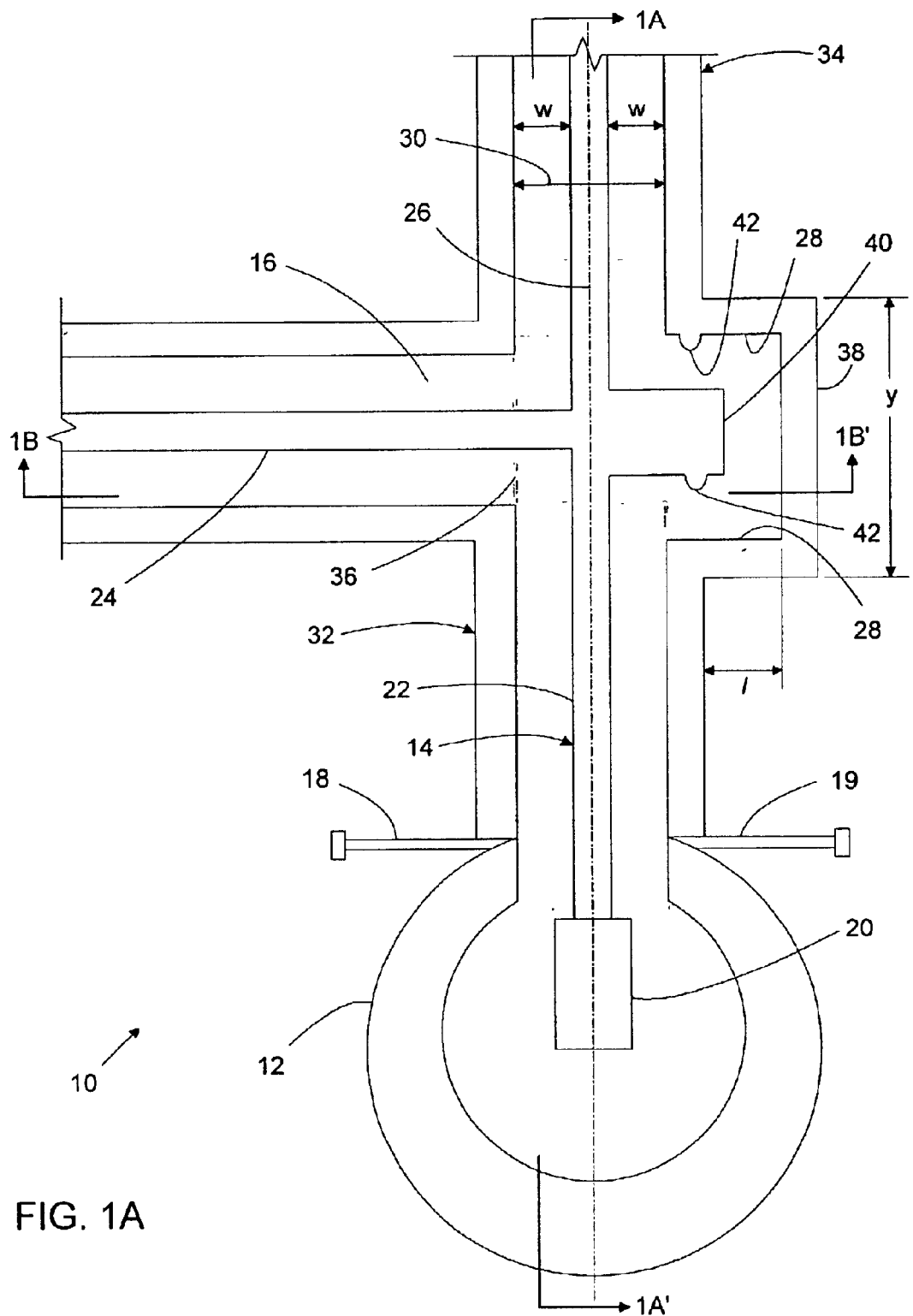
FIG. 1A is a top view of an exemplary embodiment of a MEMS device disclosed herein.

Certain exemplary embodiments will now be described to provide an overall understanding of the principles of the MEMS devices disclosed herein. One or more examples of these embodiments are illustrated in the drawings. Those of ordinary skill in the art will understand that the MEMS devices and methods of fabrication disclosed herein can be adapted and modified to provide devices and methods for other applications and that other additions and modifications can be made without departing from the scope of the present disclosure. For example, the features illustrated or described as part of one embodiment or one drawing can be used on another embodiment or another drawing to yield yet another embodiment. Such modifications and variations are intended to be included within the scope of the present disclosure.

Figure 1B:
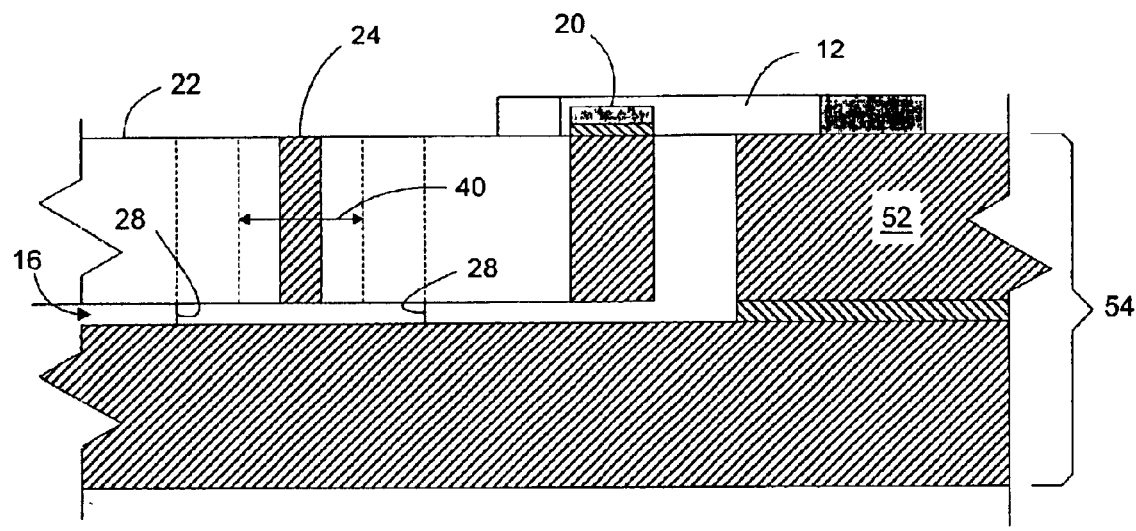
FIG. 1B is a side elevation view of the MEMS device shown in FIG. 1A along the line A–A'.
Figure 1C:
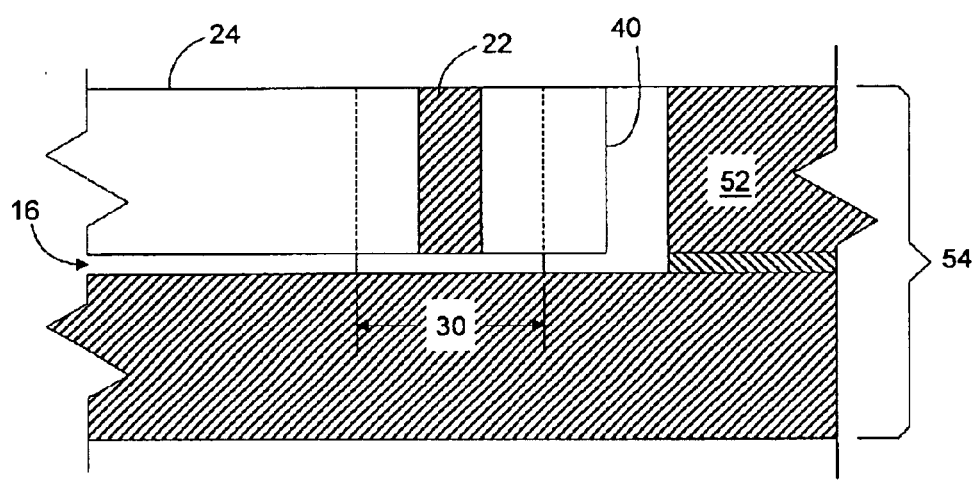
FIG. 1C is a side elevation view of the MEMS device shown in FIG. 1A along the line B–B'.

An exemplary embodiment of a MEMS device disposed on a substrate is shown in FIGS. 1A, 1B, and 1C. The MEMS device 10 can include a MEMS actuator 12 and an actuable element 14. In the exemplary embodiment, the MEMS actuator 12 can be an electromagnetic actuator, as described in greater detail in U.S. patent application Ser. No. 10/079,985, incorporated herein by reference in its entirety. Alternatively, the MEMS actuator may be another type of MEMS actuator such as, for example, an electrostatic, thermal, or piezoelectric actuator. The illustrated MEMS actuator 12 can include an electrically conductive coil arranged to generate a magnetic field within a gap 8 formed by the spaced-apart ends of the actuator 12 upon application of a current to the coil, as by first electrically conducting lead 18 and a second electrically conducting lead 19.

The actuable element 14 may be shaped to include a base 20 and an elongated arm 22 that can be coupled to and extend from the base 20. As discussed below, the base 20 or other portion of the actuable element 14 may include a layer or portion of magnetic material. The base 20 of the actuable element 14 may be positioned proximate the gap 8 such that the base 20 can be displaced relative to the gap 8 upon application of a magnetic field on the magnetic material of the actuable element 14. Optionally, a cantilever 24 or more than one cantilever 24, or other mechanism for controlling the displacement of the actuable element may be coupled to the actuable element 14 at one end and to the substrate 54 at another end. Exemplary mechanisms for controlling the displacement of the actuable element are described in U.S. patent application Ser. No. 10/079,985 and U.S. patent application Ser. No. 10/309,51, entitled MEMS Actuators, filed Feb. 21, 2002. The aforementioned patent application is incorporated herein by reference in its entirety.

In the exemplary embodiment illustrated in FIGS. 1A, 1B, and 1C, the MEMS actuator 12 can be constructed on the surface of the substrate 54 and the actuable element 14 and the cantilever 24 can be constructed from the substrate 54, preferably from a top device layer 52 of the substrate 54 in the case of a Silicon-on-Insulator (SOI) wafer. In this manner, the actuable element 14 and the cantilever 24 may be suspended over a cavity 16 (denoted by crosshatching in FIG. 1A) in the substrate 54 and thus may be free to be displaced relative to the substrate 54 along a displacement axis 26. Using the deep etching and wet etching manufacturing processes as described in more detail in U.S. patent application Ser. No. 10/079,985, all or at least a portion of the components of the MEMS device, e.g., the actuator 12, the actuable element 14 and/or the cantilever 24 (or other control mechanism), may be constructed from one or more layers of the substrate 54 to reduce the extent of the MEMS device 10 in a direction perpendicular from the substrate surface.

During the wet etching process, and particularly during removal of the MEMS device from the etching bath and during drying of the MEMS device, forces may act on the actuable element 14 or other components of the MEMS device that can result in substantial movement of the actuable element 14. For example, vibration and/or agitation of the MEMS device can cause errant motion of one or more components of the MEMS device. For example, the actuable element 14 may derail from the displacement axis 26, or the base 20 may be dislodged from its position adjacent gap 8. To resist errant motion of the actuable element 14, stops 28 may be constructed from one or more layers of substrate 54 so as to limit the movement of actuable element 14, particularly during and following wet etching.

In the exemplary embodiment of FIGS. 1A, 1B and 1C, actuable element 14 can be seen to extend along displacement axis 26 within a trench, or channel, 30 formed by sidewalls 32, 34, which can extend the depth of SOI device layer 52. Sidewalls 32, 34 may be spaced a distance w from actuable element 14, such that actuable element 14 may be generally centered in channel 30. Sidewall 32 can have an opening 36 therein to permit the cantilever 24 to connect to the actuable element 14. Sidewall 34 can have an indented portion 38 extending a distance y along the displacement axis 26, where sidewall 34 can be displaced a distance/ further from displacement axis 26 than other portions of sidewall 34.

One or more stops 28 can be formed by the opposing faces of the indented portion 38, the opposing faces being oriented generally perpendicular to the displacement axis 26. Actuable element 14 may have a stop arm 40 that can extend from actuable element 14 toward sidewall 34 so as to be between stops 28. Thus, movement of actuable element 14 along displacement axis 26 may be restricted to the movement of stop arm 40 between stops 28. The distance y can be chosen such that the movement of actuable element 14 between stops 28 is sufficient for normal operation of MEMS device 10, yet can constrain movement of actuable element, particularly during the wet etching process, to restrict derailing or dislodging of actuable element 14 from channel 30.

It is known in the art that strong interfacial adhesion, commonly referred to as stiction, may be present between contacting microstructure surfaces, such as contacting surfaces of stop arm 40 and stops 28. In certain exemplary embodiments, one, or both stops 28 and/or stop arm 40 can have a dimple 42 formed thereon, which can minimize stiction between actuable element 14 and stop 28 when actuable element 14 can contact stop 28. A dimple 42 may have a curved or angled contact surface that is configured to limit the amount of surface area contact between the contact surface of the dimple 42 and a surface of a component of a MEMS device. Alternatively, or in addition, contact surfaces of stop arm 40 and/or stops 28 may be textured and/or an anti-stiction coating may be applied thereto to minimize stiction.

It may also be known in the art that deep etching, e.g., deep reactive ion etching (DRIE), of features such as channel 30 can be better controlled when the widths of such features, e.g., the width w, may be nearly constant. The more uniform that the width can be maintained, the more uniform the etching rates may be across the feature, providing for tighter tolerances. For the exemplary embodiment of FIGS. 1A, 1B and 1C, stop arm 40 and indented portion 38 can be correspondingly shaped to maintain the width w generally constant. Other shapes that may serve to maintain a nearly constant width or distance between sidewalls 32, 34 and actuable element 14 may also be used.

In the embodiment of FIG. 1A, sidewall 32 may be shown a distance w from actuable element 14. However, it can be understood that the operation of stops 28 can require only that one sidewall be indented to form the stops 28. Thus, in one embodiment, MEMS device 10 may include only sidewall 34 and sidewall 32 may not be present, or may be located other than the distance w from actuable element 14. Also, in the embodiment of FIG. 1A, stop arm 40 may be located on actuable element 14 opposite to where cantilever 24 couples to actuable element 14, though other locations of stop arm 40 and stops 28 along displacement axis 26 may provide satisfactory control of movements during fabrication of MEMS device 10.

Figure 2:
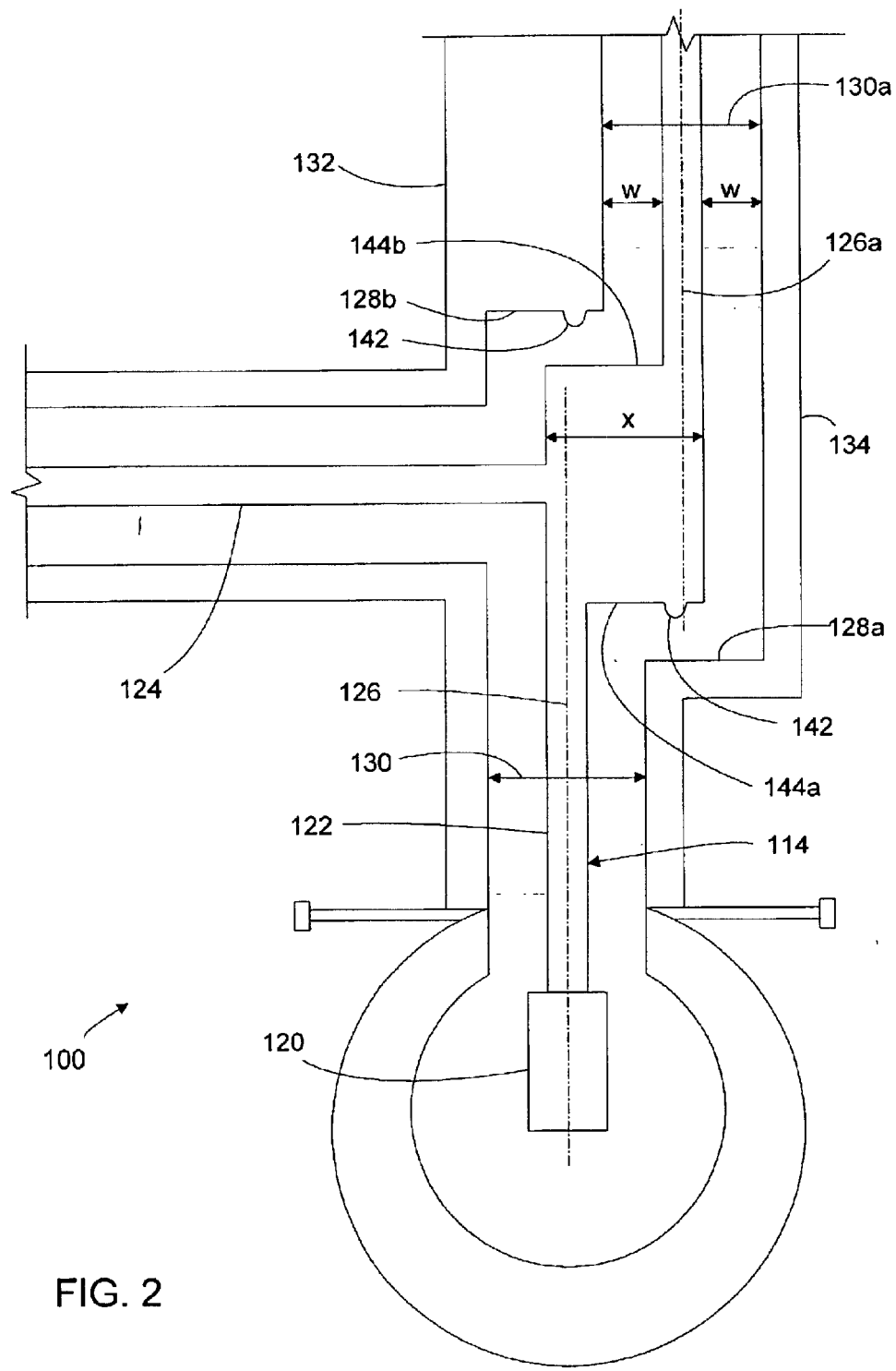
FIG. 2 is a top view of an embodiment of a MEMS device disclosed herein.

FIG. 2 can show a top view of another exemplary embodiment of a MEMS device 110. In the embodiment of FIG. 2, actuable element 114 can include an offset portion 144 in which the displacement axis 126 and elongated arm 122 can be offset, as indicated by offset displacement axis 126a and offset elongated arm portion 122a. Offset portion 144 can have a width x that can encompass elongated arm portion 122 and its offset 122a. Offset portion 144 can form offset faces 144a and 144b at opposite ends of offset portion 144. Sidewalls 132, 134 may be similarly offset such that channel 130 can be offset, as indicated by offset channel 130a, to form stops 128a and 128b that may be opposed to respective offset faces 144a, 144b. Thus, movement of actuable element 114 can be limited by faces 144a and 144b contacting respective stops 128a and 128b.

In a manner similar to that described for the embodiment of FIGS. 1A, 1B and 1C, measures can be taken to minimize stiction between offset faces 144a, 114b and respective stops 128a, 128b. One or both of stops 128a, 128b and/or offset faces 144a, 144b can have dimples 142 formed thereon to minimize stiction between stops 128a, 128b and offset faces 144a, 144b when the offset faces 144a, 144b can contact stops 128a, 128b. Alternatively, or in addition, offset faces 144a, 144b and/or stops 128a, 128b may be textured and/or an anti-stiction coating may be applied thereto. Other methods, as previously described, may also be used to minimize stiction. Also in a manner similar to that described for the embodiment of FIGS. 1A, 1B and 1C, offset portion 144 and sidewalls 132, 134 can be correspondingly shaped to maintain a width w between actuable element 114 and sidewalls 132, 134 generally constant. Other shapes that may serve to maintain a nearly constant width or distance between sidewalls 132, 134 and actuable element 114 may also be used. Further, cantilever 124 can be coupled to offset portion 144.

Figure 3:
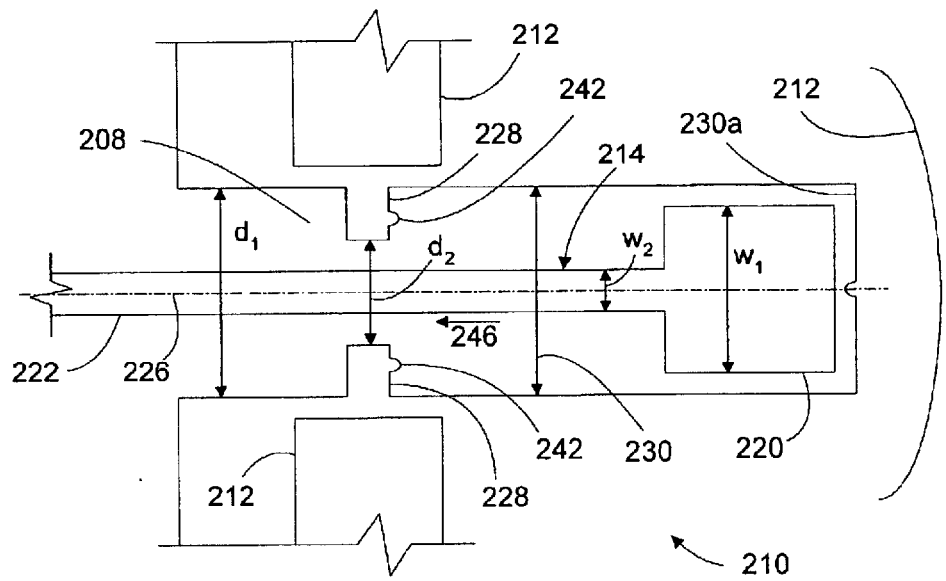
FIG. 3 is an enlarged top partial view of an embodiment of a MEMS device disclosed herein.

FIG. 3 shows an enlarged top partial view of another exemplary embodiment of a MEMS device 210. The base portion 220 of actuable element 214 can have a width $w_1$, greater than the width $w_2$ of elongated arm 222. Channel 230, which may pass through gap 208, can have a first extent $d_1$, which can be greater than width $w_1$. Stops 228 can be located at gap 208 on both sides of displacement axis 226 and can reduce the extent of channel 230 at stops 228 to an extent of $d_2$, where $d_2$ may be less than $w_1$ but greater than $w_2$. Thus, movement of actuable element 214 along displacement axis 226 in a first direction corresponding to arrow 246 can be limited by contact between base portion 220 and stops 228. Movement in the opposite direction may be limited by contact between base portion 220 and end 230a of channel 230, or between base portion 220 and actuator 212 when channel 230 may extend to actuator 212. Preferably, for ease of fabrication and to increase the opportunity for base portion 220 to contact both stops 228, the stops 228 may be symmetric about displacement axis 226. Other modes of fabrication, operation and/or design preference may have the stops 228 extend unequally into channel 230, may have only a single stop 228 to one side of displacement axis 226, or may have stops 228 that may not be located opposite one another along axis 226.

Figure 4:
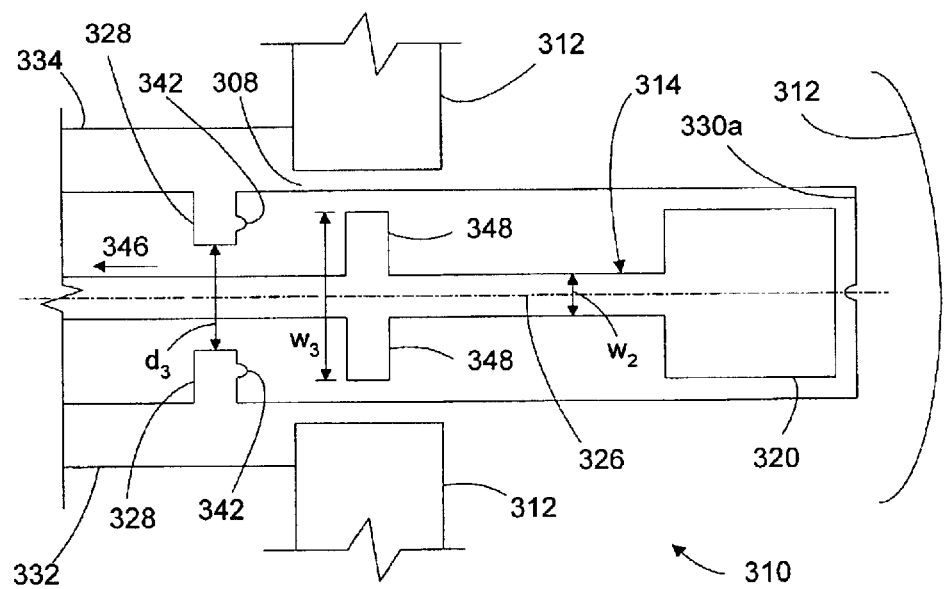
FIG. 4 is an enlarged top partial view of an embodiment of a MEMS device disclosed herein.

FIG. 4 illustrates an enlarged top partial view of another exemplary embodiment of a MEMS device 310. Stops 328 may be located along channel 330, which may pass through gap 308. Stops 328 extend into channel 330 from opposing sidewalls 332, 334 to reduce an extent of the channel 330 to an extent of $d_3$ between stops 328, where $d_3$ can be greater than a width $w_2$ of actuable element 314. Tabs 348 can extend from actuable element 314 towards sidewalls 332, 334 to increase the width of actuable element 314 from $w_2$ to a width of $w_3$ at tabs 348, where $w_3$ may be greater than $d_3$. Thus, movement of actuable element 314 along displacement axis 326 in a first direction corresponding to arrow 346 can be limited by contact between tabs 348 and stops 328. Movement in the opposite direction may be limited by contact between base portion 320 and end 330a of channel 330, or between base portion 320 and actuator 312 when channel 330 may extend to actuator 312. Preferably, for ease of fabrication and to increase the opportunity for tabs 348 to contact both stops 328, the tabs 348 and/or the stops 328 may be symmetric about displacement axis 326. Other modes of fabrication, operation and/or design preference may have the tabs 348 and/or stops 328 extend unequally and/or unsymmetrically into channel 330, provided that contact may still be made between tabs 348 and stops 328.

For the embodiments shown in FIGS. 3 and 4, measures can be taken to minimize stiction between contacting surfaces of stops 228 and base portion 220, of stops 328 and tabs 348 and of base portion 220, 320 and actuator 212, 312. Such measures can include providing dimples 242, 342 on one or both of the contacting surfaces, texturing one or both of the contacting surfaces, applying an anti-stiction coating to one or both of the contacting surfaces and/or other methods, as previously described.

While the MEMS devices disclosed herein have been particularly shown and described with reference to the exemplary embodiments thereof, those of ordinary skill in the art will understand that various changes may be made in the form and details herein without departing from the spirit and scope of the disclosure. As an example, one or more of the corners formed in the actuable elements, the sidewalls, and/or the stops illustrated in FIGS. 1A and 2–4 may be replaced with radius corners for ease of fabrication or by design choice. Those of ordinary skill in the art will recognize or be able to ascertain many equivalents to the exemplary embodiments described specifically herein by using no more than routine experimentation. Such equivalents are intended to be encompassed by the scope of the present disclosure and the appended claims.

We claim:

1. A MEMS device comprising:

a substrate, an actuable element, an actuator disposed on the surface of the substrate for selectively applying a first force to the actuable element to displace the actuable element along a displacement path adjacent at least one sidewall of a channel formed in the substrate, and a stop located on the at least one sidewall of the channel to restrict displacement of the actuable element along the path.

2. The MEMS device of claim 1, further comprising a second stop, wherein the stops are located on opposing faces of an indented portion of the at least one sidewall.

3. The MEMS device of claim 2, wherein the actuable element comprises a stop arm extending from the actuable element in a direction towards the indented portion to a point between the stops on the opposing faces of the indented portion.

4. The MEMS device of claim 3, comprising at least one cantilever coupled to the substrate at a first end and coupled to the actuable element at a second end adjacent the stop arm.

5. The MEMS device of claim 3, wherein at least one of the stops and the stop arm have contact surfaces configured to reduce stiction between the stops and the stop arm.

6. The MEMS device of claim 5, wherein the contact surfaces include at least one dimple.

7. The MEMS device of claim 3, wherein a distance between the actuable element and the at least one sidewall of the channel is generally constant along the displacement path.

8. The MEMS device of claim 1, further comprising a second stop, wherein the stops are located on opposing sidewalls of the channel and spaced apart in a direction along the displacement path.

9. The MEMS device of claim 8, wherein the actuable element comprises an offset portion between the stops, the offset portion having offset faces on opposite ends thereof, each offset face being in an opposed relationship with one of the stops.

10. The MEMS device of claim 9, comprising at least one cantilever coupled to the substrate at a first end and coupled to the actuable element at a second end adjacent the offset portion.

11. The MEMS device of claim 9, wherein at least one of the stops and the offset faces have contact surfaces configured to reduce stiction between the stops and the offset faces.

12. The MEMS device of claim 11, wherein the contact surfaces include at least one dimple.

13. The MEMS device of claim 9, wherein a distance between the actuable element and the sidewalls of the channel is generally constant along the displacement path.

14. The MEMS device of claim 1, further comprising a second stop, wherein the stops are located on opposing sidewalls of the channel, the stops extending from the sidewalls into the channel to reduce a width of the channel to less than a width of a first portion of the actuable element.

15. The MEMS device of claim 14, wherein the stops extend equally into the channel.

16. The MEMS device of claim 14, wherein the channel passes through a gap formed by spaced apart ends of a magnetic core of the actuator and the stops are located adjacent the gap.

17. The MEMS device of claim 16, wherein the stops extend equally into the channel.

18. The MEMS device of claim 14, wherein the first portion of the actuable element comprises magnetic material, a magnetic field being applied to the magnetic material within the gap by the actuator.

19. The MEMS device of claim 14, wherein the first portion comprises tabs extending from the actuable element towards the sidewalls of the channel.

20. The MEMS device of claim 19, wherein the tabs extend equally from opposing sides of the actuable element.

21. The MEMS device of claim 14, wherein at least one of the stops and the first portion of the actuable element have contact surfaces configured to reduce stiction between the stops and the first portion of the actuable element.

22. The MEMS device of claim 21, wherein the contact surfaces include at least one dimple.

23. A MEMS device comprising:

a substrate, an actuable element, an actuator disposed on the surface of the substrate for selectively applying a first force to the actuable element to displace the actuable element along a displacement path a sidewall spaced apart from the actuable element along the displacement path, the sidewall having an indented portion forming stops on opposing faces of the indented portion, the opposing faces being generally perpendicular to the displacement path, and a stop arm portion of the actuable element extending in a direction towards the indented portion to a position between the stops to restrict displacement of the actuable element to movement of the stop arm between the stops.

24. The MEMS device of claim 23, wherein a distance between the actuable element and the sidewall is generally constant along the displacement path.

25. The MEMS device of claim 23, wherein at least one of the stops and the stop arm portion have contact surfaces configured to reduce stiction between the stops and the stop arm portion.

26. The MEMS device of claim 25, wherein the contact surfaces include at least one dimple.

27. The MEMS device of claim 23, comprising at least one cantilever coupled to the substrate at a first end and coupled to the actuable element at a second end adjacent the stop arm portion.

* * * * *